United States Patent
Cho et al.

(10) Patent No.: US 11,967,491 B2
(45) Date of Patent: Apr. 23, 2024

(54) METHOD AND APPARATUS FOR PARTS CLEANING

(71) Applicant: SEMES CO., LTD., Cheonan-si (KR)

(72) Inventors: Soon-Cheon Cho, Pyeongtaek-si (KR); Su Hyung Lee, Hwaseong-si (KR); Youngran Ko, Daegu (KR); Juyong Jang, Yongin-si (KR)

(73) Assignee: SEMES CO., LTD., Cheonan-si (KR)

( * ) Notice: Subject to any disclaimer, the term of this patent is extended or adjusted under 35 U.S.C. 154(b) by 522 days.

(21) Appl. No.: 17/177,135

(22) Filed: Feb. 16, 2021

(65) Prior Publication Data

US 2021/0257193 A1    Aug. 19, 2021

(30) Foreign Application Priority Data

Feb. 18, 2020   (KR) .................. 10-2020-0019876

(51) Int. Cl.
| | | |
|---|---|---|
| *H01L 21/67* | (2006.01) | |
| *B08B 7/00* | (2006.01) | |
| *B08B 13/00* | (2006.01) | |
| *H01J 37/32* | (2006.01) | |

(52) U.S. Cl.
CPC ...... *H01J 37/32862* (2013.01); *B08B 7/0035* (2013.01); *B08B 13/00* (2013.01); *H01J 37/3244* (2013.01); *H01L 21/67034* (2013.01); *H01J 37/32192* (2013.01); *H01J 37/32825* (2013.01); *H01J 2237/002* (2013.01); *H01J 2237/335* (2013.01)

(58) Field of Classification Search
None
See application file for complete search history.

(56) References Cited

U.S. PATENT DOCUMENTS

| | | | |
|---|---|---|---|
| 2009/0159573 A1 | 6/2009 | Hwang | |
| 2012/0205652 A1* | 8/2012 | Ohmi | C23C 16/308 |
| | | | 257/43 |
| 2017/0069470 A1* | 3/2017 | Murakami | H01J 37/32541 |
| 2018/0122624 A1* | 5/2018 | Hughlett | H01J 37/32825 |

FOREIGN PATENT DOCUMENTS

| | | |
|---|---|---|
| JP | 2008-027657 | 2/2008 |
| JP | 2009-302401 | 12/2009 |
| KR | 10-1999-0081141 | 11/1999 |
| KR | 1020160070929 | 6/2016 |
| KR | 20180014899 | 2/2018 |
| KR | 20180042876 | 4/2018 |
| KR | 20180046272 | 5/2018 |
| KR | 10-1997509 | 7/2019 |
| KR | 10-2029011 | 10/2019 |
| KR | 20190136662 | 12/2019 |

OTHER PUBLICATIONS

KR20160070929 translation, Apparatus for Manufacturing Display Apparatus and Method of Manufacturing Display Apparatus, Choi (Year: 2016).*

Office Action from China National Intellectual Property Administration dated Sep. 28, 2023.

* cited by examiner

*Primary Examiner* — Cristi J Tate-Sims

(57) ABSTRACT

The present invention provides a method and apparatus for cleaning parts used in substrate processing. In a method for cleaning parts of a substrate processing, plasma generated from cleaning gas is supplied together with a cooling medium to clean the parts, but the cooling medium may be provided at a lower temperature than the plasma.

7 Claims, 4 Drawing Sheets

METHOD AND APPARATUS FOR PARTS CLEANING

CROSS-REFERENCE TO RELATED APPLICATION

A claim for priority under 35 U.S.C. § 119 is made to Korean Patent Application No. 10-2020-0019876 filed on Feb. 18, 2020, in the Korean Intellectual Property Office, the entire contents of which are hereby incorporated by reference.

FIELD OF DISCLOSURE

The present disclosure relates to a method and apparatus for cleaning parts used in a substrate processing.

BACKGROUND

In the process of manufacturing a semiconductor device, various processes are carried out including photolithography, etching, thin film deposition, ion implantation, and cleaning etc. Among such processes, a substrate processing apparatus using process gas is used for etching, thin film deposition, ion implantation, and cleaning processes.

A drying processing process is generally performed in a substrate processing apparatus sealed from the outside. The substrate processing apparatus includes various parts including a chamber, a substrate support unit, a gas supply unit, and a door that opens and closes the chamber etc.

A great amount of process gas remains in such parts during or after the drying processing process. The residual process gas acts as a contaminant contaminating the substrate in the next drying processing process. Thus, after the drying processing process is carried out a plurality of times, a maintenance work is performed to clean each part.

The maintenance work is largely divided into a liquid processing process and a plasma processing process. The liquid processing process includes a cleaning process by immersing parts in chemicals of strong acids or strong bases. The liquid processing process does not completely remove byproducts and has environmental problems including wastewater etc.

The plasma processing process includes a process of supplying plasma generated in a high temperature atmosphere to parts. FIG. 1 is a cross-sectional view illustrating a part cleaned by a conventional plasma processing process. Referring to FIG. 1, the plasma processing process is carried out in an atmosphere of 500 to 1000° C., which is higher than the melting point of the parts and thus, causes thermal damage to the part during the process.

SUMMARY

The present disclosure is directed to providing an apparatus and a method for cleaning parts of a substrate processing apparatus which is capable of improving the stability of parts.

The present disclosure is also directed to provide an apparatus and method for cleaning parts of a substrate processing apparatus which is capable of preventing thermal damage to the parts.

An exemplary embodiment of the present disclosure provides a method and apparatus for cleaning parts of an apparatus used in substrate processing.

In an embodiment of the prevention, a method for parts cleaning is directed to cleaning the parts by supplying plasma generated from cleaning gas with a refrigerant, but the temperature of the cooling medium may be provided at a lower than that of the plasma.

In an embodiment of the prevention, plasma and cooling medium are supplied from a parts cleaning apparatus including a supply member, and a position at which the cooling medium is introduced into the supply member may be closer to the discharge port of the supply member than a position at which the cleaning gas is introduced into the supply member.

In an embodiment of the prevention, the cooling medium may include liquid pure water.

In an embodiment of the prevention, the cooling medium may be supplied in the form of a spray.

In an embodiment of the prevention, the cooling medium may be continuously supplied while the plasma is discharged.

In an embodiment of the prevention, the cooling medium may be supplied when the temperature of the plasma exceeds a preset range.

In an embodiment of the prevention, the parts cleaning apparatus may further include: a gas supply member that supplies cleaning gas into the supply member; a plasma source that generates plasma from the cleaning gas provided in the supply member; a cooling medium supply member that supplies the cooling medium into the supply member.

In an embodiment of the prevention, the supply member includes: a body part having a first space formed therein, a discharge part having a second space extending from the first space and discharging, and the plasma, but the discharge port may be provided in the discharge part.

In an embodiment of the prevention, the cleaning gas may be introduced into the first space, and the cooling medium may be introduced into the second space.

In an embodiment of the prevention, the second space may extend in a vertical direction from the first space.

In an embodiment of the prevention, the parts may include a ceramic-coated metal.

According to an embodiment of the present invention, an apparatus for cleaning a part of a substrate processing apparatus includes a plasma supply member that discharges plasma, a gas supply member that supplies a cleaning gas into the plasma supply member, a plasma source that forms plasma from the cleaning gas provided in the plasma supply member; a cooling medium supply member that supplies a cooling medium into the plasma supply member to cool the plasma in the plasma supply member.

In an embodiment of the prevention, the plasma supply member includes a body part having a first space where the plasma is generated, the plasma source being installed in the first space of the body part; a discharge part having a second space connected to the first space and the cooling medium supply member, the cooling medium and plasma being discharged through a discharge port connected to the discharge part.

In an embodiment of the prevention, the cleaning gas may be introduced into the first space of the body part, the cooling medium being introduced into the second space of the discharge part, and the plasma being transferred from the first space of the body part to the second part of the discharge part, and being discharged through the discharge port of the discharge part.

In an embodiment of the prevention, the second space extend in a vertical direction from the first space.

In an embodiment of the prevention, the cooling medium supply member supplies the cooling medium to the second space in a spraying manner.

In an embodiment of the prevention, the cooling medium includes liquid pure water.

In an embodiment of the prevention, the apparatus further comprises a controller that controls the gas supply member and the cooling medium supply member so that the cooling medium is continuously supplied during being supplied with the cleaning gas.

In an embodiment of the prevention, the apparatus further comprises a sensor that measures a temperature of a plasma supplied to a part, and a controller that controls the gas supply member and the cooling medium supply member based on the temperature of the plasma received from the sensor. The controller controls the cooling medium supply member so that the cooling medium is supplied to the supply member when the temperature of plasma is out of a preset range.

In an embodiment of the prevention, the part includes a ceramic-coated metal.

According to an embodiment of the present invention, plasma is supplied together with the cooling medium. Accordingly, the temperature of the parts may be prevented from exceeding the preset range.

In addition, according to an embodiment of the present invention, the cooling medium is supplied in the form of a spray. Accordingly, the cooling medium is uniformly mixed with the plasma, so that the temperature of the plasma can be uniformly decreased for each region.

DETAILED DESCRIPTION

Figure 1:
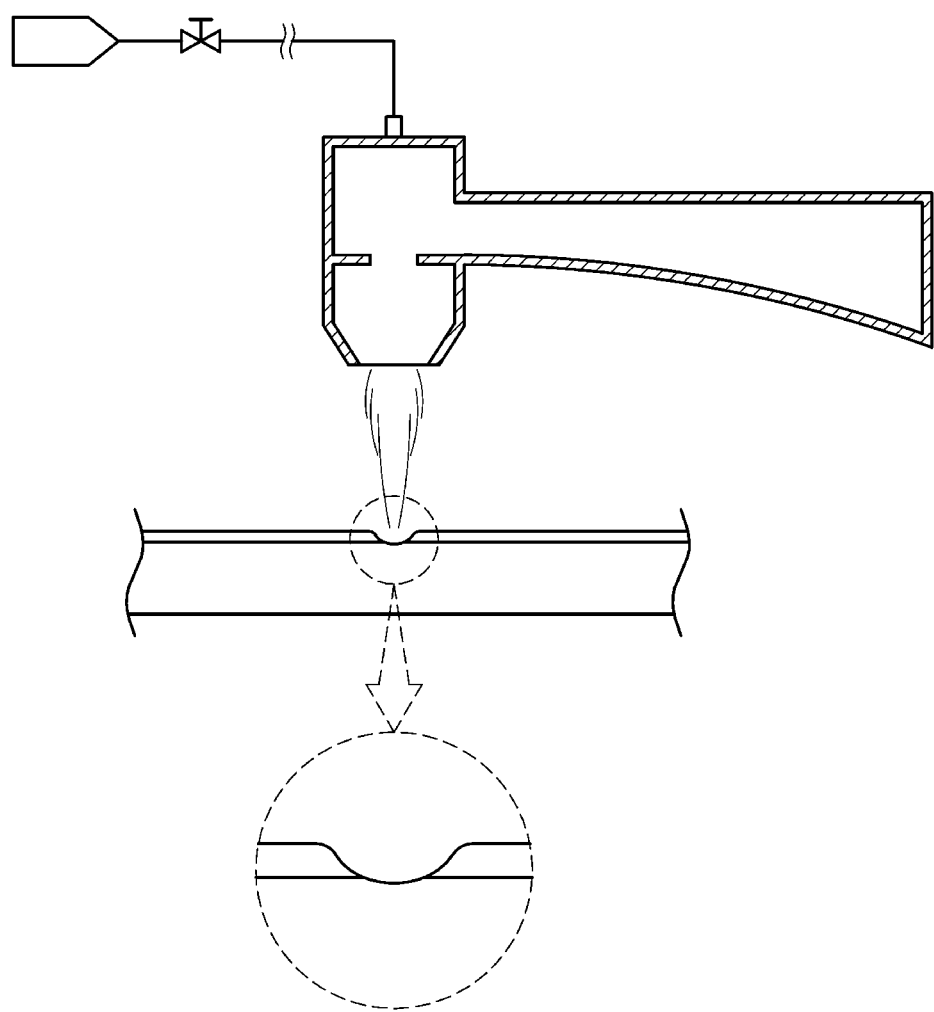
FIG. 1 is a cross-sectional view illustrating parts cleaned by a conventional plasma processing process.

The present disclosure may be embodied in many different forms and the scope of the disclosure is not intended to interpret to limit the invention to the following embodiments described below. This embodiment is provided to more completely explain the present invention to those skilled in the art having an average knowledge in the field to which the present invention belongs. Thus, the shape of parts etc. in the drawing have been necessarily exaggerated in order to emphasize a precise description.

The embodiment describes a method for cleaning parts of an apparatus that etches a substrate using plasma. However, the present invention is not limited thereto, and can be applied in various ways as long as it is a cleaning method for parts of a substrate processing apparatus.

Hereinafter, exemplary embodiments of the present invention will be described with reference to FIGS. 2 to 6.

Figure 2:
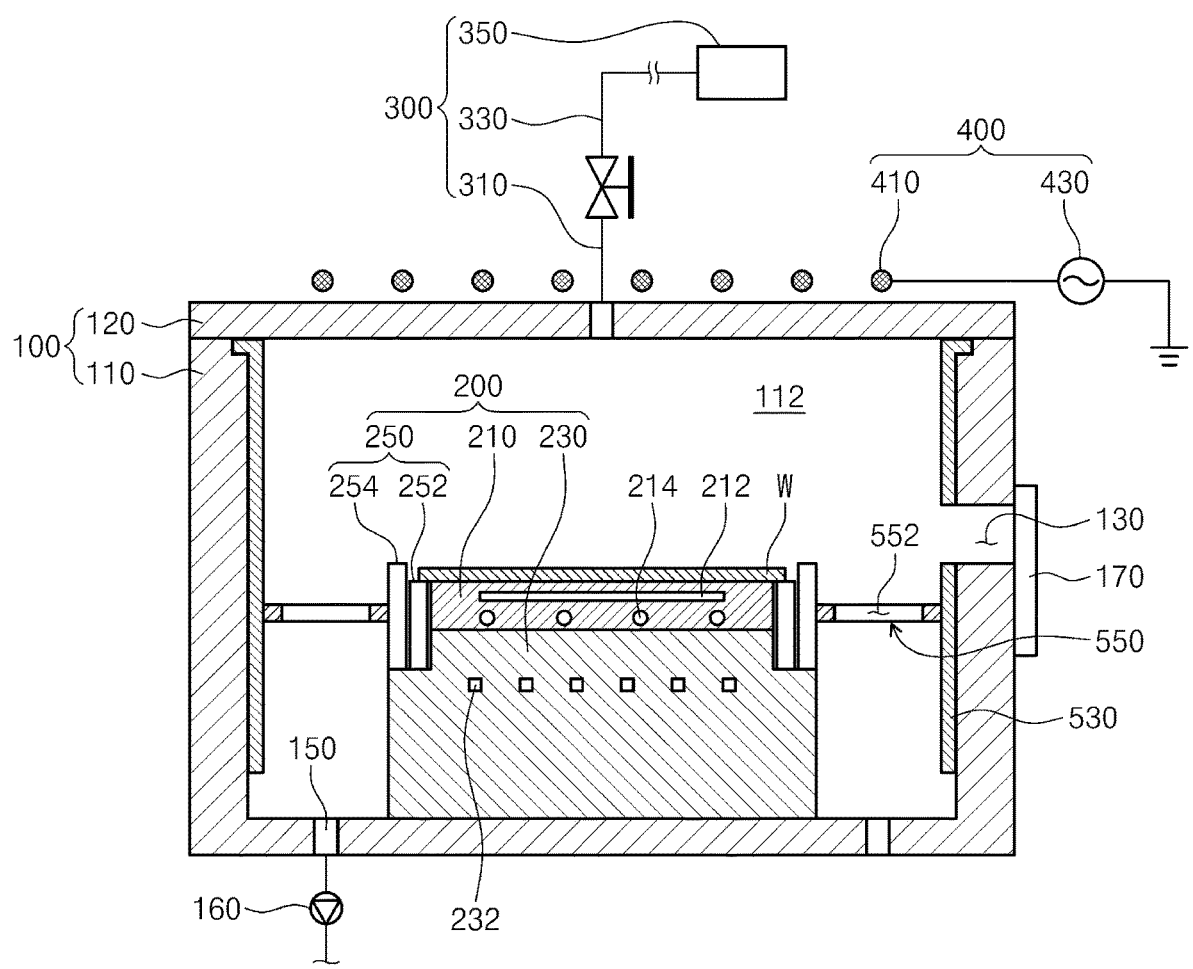
FIG. 2 is a cross-sectional view illustrating a substrate processing apparatus according to an embodiment of the present disclosure.

FIG. 2 is a cross-sectional view illustrating a substrate processing apparatus according to an embodiment of the present invention. Referring to FIG. 2, the substrate processing apparatus includes a chamber 100, a substrate support unit 200, a ring assembly 250, a gas supply unit 300, a plasma source 400, a liner 530, and a baffle 550.

The chamber 100 provides a processing space 112 in which the substrate W is processed.

The chamber 100 includes a body 110, a cover 120, and a door 170. The body 110 is provided in a cylindrical shape with an upper portion being open. The cover 120 is provided to open and close the upper portion of the body 110. The body 110 is provided with a plasma-exposed surface and a plasma non-exposed surface, the plasma-exposed surface and the plasma non-exposed surface provided in different materials from each other. The inner surface of the body 110, which is the plasma-exposed surface, is provided with a ceramic material, and the outer surface of the body 110, which is the plasma-non-exposed surface, is provided with a metal material. For example, the outer surface of the body 110 may be provided with an aluminum material. The cover 120 may be provided with a dielectric material. An exhaust hole 150 is provided at the bottom of the body 110. The exhaust hole 150 is connected to a pressure reducing member 160 through an exhaust line. The pressure reducing member 160 provides vacuum pressure to the exhaust hole 150 through the exhaust line. Byproducts generated during the process are discharged to the outside of the chamber 100 by vacuum pressure. An opening 130 is provided at one side wall of the body 110. The opening 130 functions as a passage through which the substrate W is carried in and out. The opening 130 is provided to open along a horizontal direction. When viewed from the lateral side, the opening 130 is provided in a slit shape that penetrates the chamber 100.

The door 170 opens and closes the processing space 112. The door 170 is located adjacent to the opening 130 at the outer surface of the body 110. The door 170 is movable between an open position and a blocking position to open and close the opening 130. At the blocking position, the door 170 close the opening 130, and the open position is set where the door 170 is out of the blocking position with the opening 130 opened.

The substrate support unit 200 supports the substrate W in the processing space 112. The substrate support unit 200 may be provided as an electrostatic chuck 200 that supports the substrate W using electrostatic force. However, the substrate support unit 200 may support the substrate W in various ways such as mechanical clamping.

The electrostatic chuck 200 includes a dielectric plate 210 and a base 230. The substrate W is directly placed on the upper surface of the dielectric plate 210. The dielectric plate 210 is provided in a disk shape. The dielectric plate 210 may have a radius smaller than that of the substrate W. According to an embodiment, the upper end of the dielectric plate 210 may be provided at a position corresponding to the opening 130 of the chamber 100. Pin holes (not illustrated) are provided at the upper surface of the dielectric plate 210. The pin holes are provided in plural. For example, the three pinholes are provided, and may be spaced apart from each other at equal intervals. A lift pin (not illustrated) is located in each of the pin holes, and the lift pin is moved up and down to lift or lower the substrate. A lower electrode 212 is installed inside the dielectric plate 210. A power source (not illustrated) is connected to the lower electrode 212, and power is applied from a power source (not illustrated). The lower electrode 212 provides electrostatic force from the applied power (not illustrated) so that the substrate W is adsorbed to the dielectric plate 210. A heater 214 that heats the substrate W is installed inside the dielectric plate 210. The heater 214 may be located under the lower electrode

212. The heater 214 may be provided as a spiral coil. For example, the dielectric plate 210 may be made of a material including ceramic. The dielectric plate 210 may be made of a material including alumina (Al2O3).

The base 230 supports the dielectric plate 210. The base 230 is located under the dielectric plate 210 and is fixedly coupled to the dielectric plate 210. The upper surface of the base 230 has a stepped shape such that the central region thereof is higher than the edge region. The central region of the upper surface of base 230 has an area corresponding to the lower surface of the dielectric plate 210. A cooling fluid channel 232 is formed inside the base 230. The cooling fluid channel 232 is provided as a passage through which cooling gas circulates. The cooling fluid channel 232 is provided to be connected to a respective groove formed at the upper surface of the dielectric plate 210. The cooling fluid channel 232 may be provided in a spiral shape inside the base 230.

The ring assembly 250 concentrates the plasma onto the substrate W. The ring assembly 250 includes an inner ring 252 and an outer ring 254. The inner ring 252 is provided in an annular ring shape surrounding the dielectric plate 210. The inner ring 252 is located in the edge region of the base 230. The upper surface of the inner ring 252 is provided to have the same height as the upper surface of the dielectric plate 210. The inner portion of the upper surface of the inner ring 252 supports an edge region of the bottom surface of the substrate W. The outer ring 254 is provided in an annular ring shape surrounding the inner ring 252. The outer ring 254 is located adjacent to the inner ring 252 in the edge region of the base 230. The upper surface of the outer ring 254 is provided with a height higher than that of the inner ring 252. According to an embodiment, the ring assembly may be made of a material including ceramic.

The gas supply unit 300 supplies a process gas onto the substrate W supported by the substrate support unit 200. The gas supply unit 300 includes a gas storage unit 350, a gas supply line 330, and a gas inlet port 310. The gas supply line 330 connects the gas storage unit 350 and the gas inlet port 310. The process gas stored in the gas storage unit 350 is supplied to the gas inlet port 310 through the gas supply line 330. A valve is installed in the gas supply line 330 to open and close the passage thereof, or to control the flow rate of the gas flowing through the passage thereof. For example, the process gas may be a gas containing carbon (C), for example, methane gas (CH4). The process gas may be a gas containing fluorine (F), for example, nitrogen trifluoride (NF3). Other gases may be used as the process gas, and mixed process gas containing two or more gases may be used as the process gas.

The plasma source 400 excites the process gas in the chamber 100 into a plasma state. As for the plasma source 400, an inductively coupled plasma (ICP) source may be used. The plasma source 400 includes an antenna 410 and an external power source 430. The antenna 410 is disposed on the outer upper portion of the chamber 100. The antenna 410 is provided in a spiral shape that is wound a plurality of times, and is connected to the external power source 430. The antenna 410 receives power from the external power source 430. The antenna 410 receives power from the external power source 430. The power-received antenna 410 excites the processing gas in the plasma state in the processing space 112.

The liner 530 protects the inner wall of the chamber 100. The liner 530 is provided to have an annular ring shape. The liner 530 is located in the chamber 100 between the substrate support unit 200 and the inner wall of the chamber 100. The liner 530 is located closer to the chamber 100 than the substrate support unit 200. The liner 530 is provided with a plasma-exposed surface and a plasma-non-exposed surface which are provided in different materials. For example, an inner surface of the liner 530, which is the exposed surface, may be made of a ceramic material, and an outer surface of the liner 530, which is the exposed surface may be made of a metal material.

Figure 3:
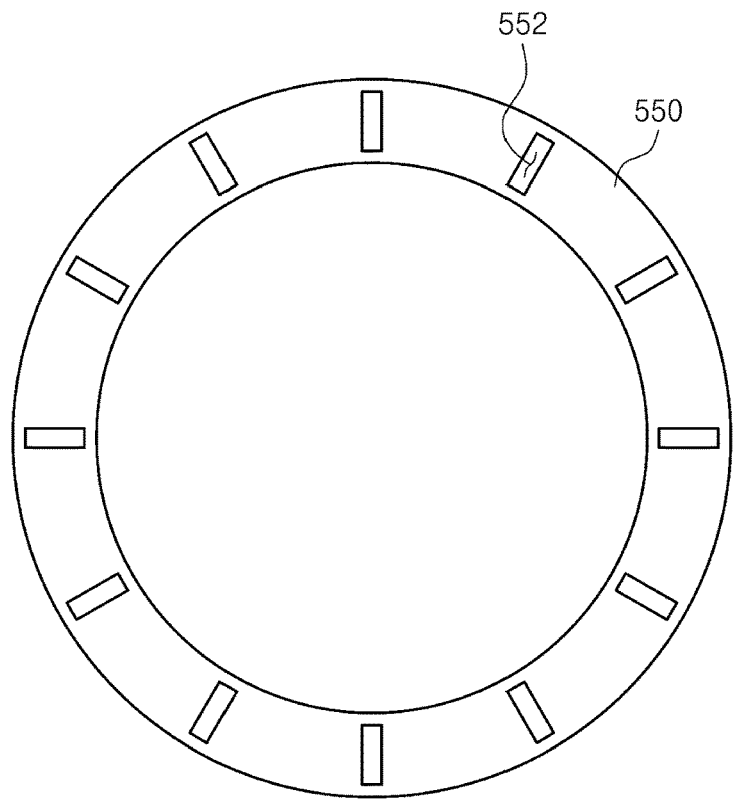
FIG. 3 is a plan view illustrating a baffle of FIG. 2.

The baffle 550 adjusts the amount of process gas to be uniform for each area. FIG. 3 is a top plan view illustrating the baffle of FIG. 2. Referring to FIG. 3, the baffle 550 is provided to have an annular ring shape. In addition, the baffle 550 is provided to have a plate shape. A plurality of baffle holes 552 are formed in the baffle 550. The baffle holes 552 are arranged along the circumferential direction of the baffle 550. Each of the baffle holes 552 may be elongated along the radial direction of the baffle 550. In one example, the baffle holes 552 are provided in a slit shape. Each baffle hole 552 is provided to be spaced apart from each other at equal intervals. For example, the baffle 550 may be made of a material including ceramic.

Next, a method for cleaning parts of a substrate processing apparatus described above will be described. Hereinafter, the parts of the substrate processing apparatus may be items, disassembled from the substrate processing apparatus, such as the chamber 100, the dielectric plate 210, the ring assembly 250, the liner 530, and the door 170. For example, the present embodiment provides a method for cleaning parts which were exposed to plasma during fabrication processes. The present invention is not limited thereto. For example, the parts, without being disassembled for cleaning, of the substrate processing apparatus may be cleaned.

Each part is removed from the substrate processing apparatus and introduced into a cleaning equipment where the part is cleaned. The cleaning equipment is located outside the substrate processing apparatus. The cleaning equipment cleans parts using plasma generated from a cleaning gas. In this embodiment, a substrate processing plasma is referred to as a process plasma and a part cleaning plasma is referred to as a cleaning plasma in order to distinguish between a plasma processing a substrate and a plasma processing a part. The cleaning equipment cleans the parts by generating a cleaning plasma from the cleaning gas. As an example of the cleaning equipment, a cleaning plasma processing apparatus is described as an example of using microwaves at an atmospheric pressure at a temperature higher than the room temperature.

Figure 4:
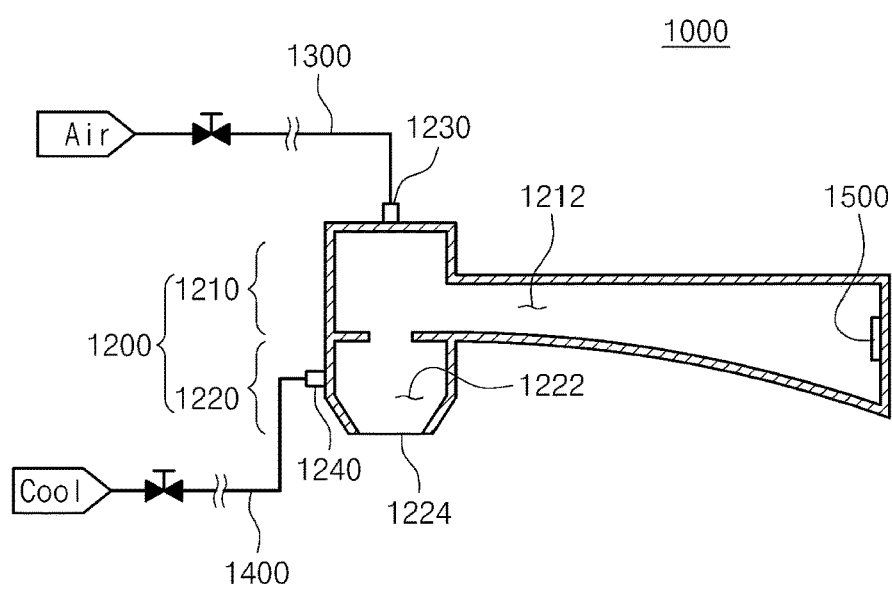
FIG. 4 is a cross-sectional view illustrating an apparatus of parts cleaning.
Figure 5:
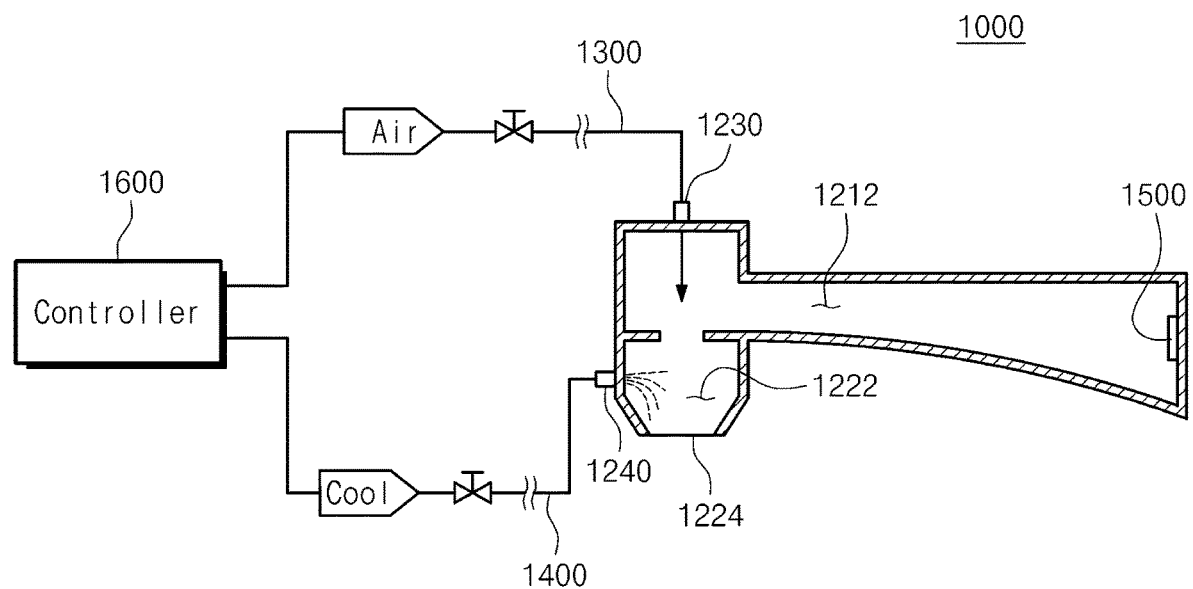
FIG. 5 is a view illustrating a process of parts cleaning using the apparatus of FIG. 4.
Figure 6:
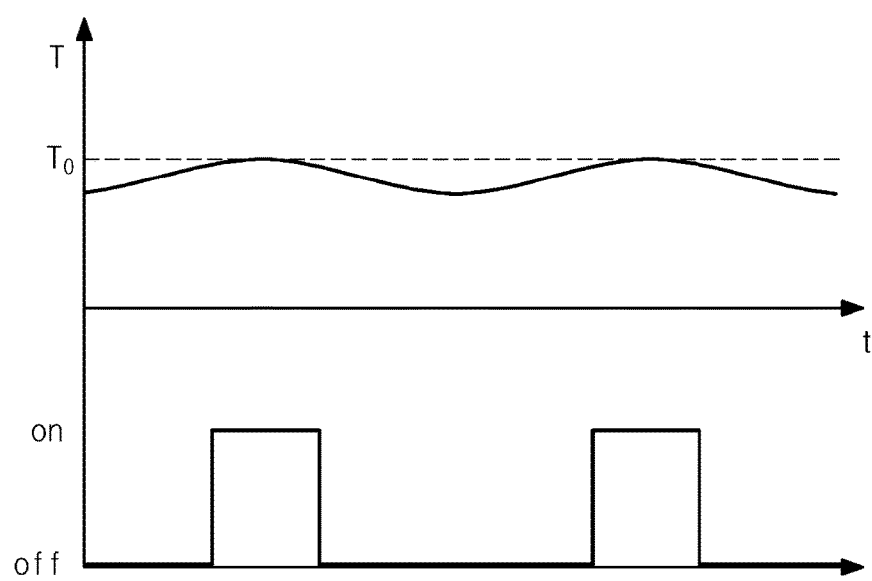
FIG. 6 is a graph illustrating an embodiment of a cooling medium supply in a process of cleaning the parts using the apparatus of FIG. 4.

FIG. 4 is a cross-sectional view illustrating a parts cleaning apparatus. Referring to FIG. 4, the parts cleaning apparatus 1000 includes a supply member 1200, a plasma source 1500, a gas supply member 1300, a cooling medium supply member 1400, and a controller 1600 (see FIG. 5). The supply member 1200 has an internal space in which gas is supplied. The internal space is in communication with a discharge port 1224 through which gas is discharged. The supply member 1200 has a gas inlet 1230 into which gas is introduced and a cooling medium inlet 1240 into which a cooling medium is introduced. The gas supply member 1300 is connected to the gas inlet 1230, and the cooling medium supply member 1400 is connected to the cooling medium inlet 1240. For example, the gas inlet 1230 may be located opposite to the discharge port 1224. The cooling medium inlet 1240 may be provided in a vertical or oblique direction with respect to a direction in which the gas inlet 1230 and the discharge port 1224 are arranged. A direction in which the gas inlet 1230 and the discharge port 1224 are arranged may be provided to be parallel to the longitudinal direction of the supply member 1200. The gas may be air, and the cooling medium may be pure water.

An inner space of the supply member 1200 has a first space 1212 and a second space 1222. The first space 1212 is located closer to the gas inlet 1230. For example, the first space 1212 is located much closer to the gas inlet 1230 comparing to a discharge port 1224. And the second space 1222 is located closer to the discharge port 1224. For example, the second space 1222 is located much closer to the discharge port 1224 comparing to the gas inlet 1230. In the case that the supply member 1200 supplies plasma from the top of the part, the first space 1212 may be an upper space and the second space 1222 may be a lower space.

The supply member 1200 includes a body part 1210 and a discharge part 1220. The body part 1210 has a first space 1212 therein, and the discharge part 1220 has a second space 1222 therein, which is in communication with the first space 1212. The discharge part 1220 is provided to extend from the body part 1210. The discharge part 1220 is provided to have a length direction different from the length direction of the body part 1210. The body part 1210 is provided to extend in a first direction (e.g., the body part 1210 extends horizontally), and the discharge part 1220 is provided to extend in a second direction different from the first direction (e.g., the discharge part 1220 extends vertically). For example, the discharge part 1220 is coupled to one end portion of the body part 1210 and the plasma source 1500 is located inside (e.g., sidewall) the other end portion of the body part 1210. The first space 1212 of the body part 1210 communicates with (e.g., is connected to) the second space 1222 of the discharge part 1220 via communication hole. The communication hole may be provided in a single or in plural. The diameter of the communication hole may be smaller than the width of the second space 1222. In an alternative embodiment, the diameter of the communication hole may be the same size as the width of the second space 1222. The first direction and the second direction may be provided to have an acute angle. The shape and size of the body part 1210 and the discharge part 1220 may be varied according to a desired application. A gas inlet 1230 is provided in the body part 1210, for example in the one end portion of the body part 1210 with opposing the discharge port 1224. The gas introduced through the gas inlet 1230 may be moved straight forward and may pass through the first space 1212 (e.g., downwardly) and enter into the second space 1222. The discharge part 1220 extends from the body part 1210 and has a discharge port 1224 formed at an end (e.g., lower end) thereof. A cooling medium inlet 1240 is provided in the discharge part 1220 (e.g., sidewall thereof). The cooling medium introduced into the second space 122 through the cooling medium inlet 1240 does not pass through the first space 1212 and is discharged from the second space 1222 via the discharge port 1224.

The plasma source 1500 forms an electric field in the first space 1212. According to an embodiment, the plasma source 1500 may apply microwaves to the first space 1212. An electric field is formed in the first space 1212, and the gas supplied to the first space 1212 via gas inlet is excited into plasma.

The gas supply member 1300 supplies cleaning gas to the gas inlet 1230. The gas supply member 1300 includes a gas supply line connected to the gas inlet 1230. According to an embodiment, the cleaning gas may be air. Air is excited by a plasma source 1500 in the first space 1212 to form nitrogen plasma and oxygen plasma. Each plasma is moved to the second space 1222. Accordingly, the second space 1222 is provided as a discharge space together with the first space 1212.

The cooling medium supply member 1400 supplies a cooling medium to a cooling medium inlet 1240. The cooling medium is supplied to the second space 1222 via the cooling medium inlet 1240 to cool the gas plasma generated in the first space 1212 and introduced into the second space 1222. The cooling medium supply member 1400 includes a cooling medium supply line connected to the cooling medium inlet 1240. According to an embodiment, the cooling medium may be pure water. Pure water can be provided in liquid form. In an embodiment, the pure water may be a filtered water or a de-ionized water.

The cooling medium supply member 1400 supplies the cooling medium to the second space 1222 in spraying manner. Accordingly, the contact area between the plasma and the cooling medium can be widened, and it can be uniformly mixed with the plasma. In addition, a path through which plasma is supplied is provided as a discharge space. Accordingly, a portion of the cooling medium may be excited into plasma. Accordingly, the cleaning plasma supplied to the parts is provided as a plasma in which plasma generated from gas and plasma generated from a portion of the cooling medium are mixed. The cooling medium excited in the second space 1222 forms a hydrogen plasma. According to an embodiment, each of the nitrogen plasma and the oxygen plasma may remove carbon (C) as a target. In addition, hydrogen plasma can remove fluorine (F) as a target. Each plasma can remove target particles by forming a radical.

Hydrogen gas has a very small molecular weight compared to nitrogen and oxygen gases contained in air. For this reason, when the hydrogen gas passes through the electric field with air, the electric field is unstable, and as the flow rate of the hydrogen gas increases, the instability of the electric field increases. Hydrogen gas has a smaller molecular weight than air, and plasma generation is easier than air. Thus, the hydrogen gas supply path does not include an electric field, and hydrogen plasma can be formed by the excited air, and at the same time, a stable discharge space can be maintained.

The controller 1600 controls the gas supply member 1300 and the cooling medium supply member 1400 to prevent parts from being thermally damaged by the cleaning plasma. The controller 1600 controls the gas supply member 1300 and the cooling medium supply member 1400 so that the cooling medium is continuously supplied while the cleaning gas is supplied to the gas inlet 1230. The cooling medium cools the plasma, thereby preventing the temperature of the plasma from exceeding the preset range. For example, the parts may be include or may be formed of a ceramic-coated metal. The preset range may be a temperature at which the ceramic is separated from the metal or may be a temperature lower than the melting point of the metal. The preset range may be 500 to 700° C. The ceramic may include yttrium oxide (Y2O3), and the metal may include aluminum (Al).

In the aforementioned embodiment, it is assumed that the cooling medium is continuously supplied while the cleaning gas is supplied. However, the supply of the cooling medium may be turned on/off according to specific conditions. The sensor measures the temperature of plasma supplied to the part, and the temperature of plasma measured from the sensor may be transmitted to the controller 1600. The controller 1600 controls the supply of the cooling medium based on the received temperature. According to an embodiment, the controller 1600 supplies the cooling medium when the temperature of plasma is out of the preset range (T0), and may control the cooling medium supply member 1400 to stop supplying the cooling medium when the temperature of plasma is within the preset range (T0). Can be controlled. For example, the preset range (T0) may be 700° C. Accordingly, it is possible to prevent the parts from being thermally damaged.

In the aforementioned embodiment, although the ring assembly 250, the chamber 100, the dielectric plate 210, the liner 530, and the door 170 have been described as cleaning, the cover 120 and the substrate support unit 200, the gas supply unit 300, and the baffle 550 may be cleaned if they are exposed to plasma.

In addition, according to the present embodiment, it is assumed that the plasma source 400 of the gas processing apparatus is provided as an inductively coupled plasma (ICP) source. However, a capacitively coupled plasma (CCP) may be used as the plasma source 400. The plasma source 400 has a shower head facing the substrate support unit 200, and electrodes may be provided to each of the substrate support unit 200 and the shower head. An electromagnetic field may be formed between both electrodes. The shower head may be cleaned by cleaning equipment.

In addition, according to the embodiment, it is assumed that the parts of the plasma processing apparatus are cleaned. However, the present embodiment is not limited thereto, and any part of an apparatus for drying processing the substrate W using a process gas may be cleaned. For example, the drying processing may include a process of treating the substrate W by decomposing a gas at a temperature higher than room temperature without generating plasma. The drying processing may be a process of etching the substrate W or depositing a thin film.

What is claimed is:

1. An apparatus for cleaning a part of a substrate processing apparatus, the apparatus comprising:
    a plasma supply member configured to discharge plasma;
    a gas supply member configured to supply a cleaning gas into the plasma supply member;
    a plasma source configured to generate plasma from the cleaning gas provided in the plasma supply member; and
    a cooling medium supply member configured to supply a cooling medium into an internal space of the plasma supply member to cool the plasma in the plasma supply member,
    wherein the internal space of the plasma supply member includes a first space and a second space that are connected with each other,
    wherein the plasma supply member comprises:
        a body part having the first space where the plasma is generated,
    wherein the plasma source is installed in the first space of the body part; and
        a discharge part having the second space connected to the first space and the cooling medium supply member,
    wherein the cooling medium is supplied into the second space of the discharge part from the cooling medium supply member,
    wherein the cooling medium and the plasma are discharged through a discharge port connected to the discharge part,
    wherein the cleaning gas is introduced into the first space of the body part, and
    wherein the plasma is transferred from the first space of the body part to the second space of the discharge part, and is discharged through the discharge port of the discharge part.

2. The apparatus of claim 1,
    wherein the second space extends in a vertical direction from the first space.

3. The apparatus of claim 1,
    wherein the cooling medium supply member is configured to spray the cooling medium to the second space.

4. The apparatus of claim 1,
    wherein the cooling medium is liquid pure water.

5. The apparatus of claim 1, further comprising,
    a controller configured to control the gas supply member and the cooling medium supply member so that the cooling medium is continuously supplied during a time when the cleaning gas is supplied.

6. The apparatus of claim 1, further comprising,
    a sensor configured to measure a temperature of the plasma supplied to the part; and
    a controller configured to control the gas supply member and the cooling medium supply member based on the temperature of plasma received from the sensor,
    wherein the controller is configured to further control the cooling medium supply member to supply the cooling medium to the cooling medium supply member when the temperature of the plasma is out of a preset range.

7. The apparatus claim 1,
    wherein the part to be cleaned comprises a ceramic-coated metal.

* * * * *